US006312965B1

(12) United States Patent
Cathey, Jr.

(10) Patent No.: US 6,312,965 B1
(45) Date of Patent: Nov. 6, 2001

(54) METHOD FOR SHARPENING EMITTER SITES USING LOW TEMPERATURE OXIDATION PROCESS

(75) Inventor: David A Cathey, Jr., Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/878,276

(22) Filed: Jun. 18, 1997

Related U.S. Application Data

(62) Division of application No. 08/334,818, filed on Nov. 4, 1994, now Pat. No. 5,923,948.

(51) Int. Cl.[7] .................................................... H01L 21/00

(52) U.S. Cl. ................................ 438/20; 216/11; 445/50; 445/51

(58) Field of Search ............................ 438/20, 770, 771; 445/50, 51, 24; 216/11; 313/309

(56) References Cited

U.S. PATENT DOCUMENTS

| | | | |
|---|---|---|---|
| 3,500,102 | 3/1970 | Crost et al. | 313/109 |
| 3,798,752 | 3/1974 | Fujimoto | 29/571 |
| 3,814,968 | 6/1974 | Nathanson et al. | 313/95 |
| 3,970,887 | 7/1976 | Smith et al. | 313/309 |
| 4,874,981 | 10/1989 | Spindt | 313/309 |
| 4,940,916 | 7/1990 | Borel et al. | 313/306 |
| 5,039,625 | 8/1991 | Reisman et al. | 437/69 |
| 5,100,355 | 3/1992 | Marcus et al. | 445/24 |

(List continued on next page.)

FOREIGN PATENT DOCUMENTS

| | | | |
|---|---|---|---|
| 0 508 737A1 | 10/1992 | (EP) | H01J/9/02 |
| WO 94/03916 | 2/1994 | (WO) | H01J/9/02 |

OTHER PUBLICATIONS

L. E. Katz and L. C. Kimerling, "Defect Formation During High Pressure, Low Temperature Steam Oxidation of Silicon", J. Electrochem. Society, vol. 125, No. 10, 1978, pp. 1680–1683.

Kamal Eljabaly and Arnold Reisman, "Growth Kinetics and Annealing Studies of the "Cathodic" Plasma Oxidation of Silicon", J. Electro–chem. Soc., vol. 138, No. 4, Apr. 1991, pp. 1064–1070.

"Enhancement in Field Emission Current From Dry–Processed N–Type Si Field Emitter Arrays After Tip Anodization", M. Takai, Mar. 1994, Revue "Le Vide, les Couches Minces", pp. 405–408.

"Formation of Silicon Tips With <1nm radius", Marcus et al., Nov. 5, 1989.

"Atomically Sharp Silicon and Metal Field Emitter", Marcus et al., Oct. 1991, IEEE, vol. 38, No. 10.

(List continued on next page.)

*Primary Examiner*—Charles Bowers
*Assistant Examiner*—Jack Chen
(74) *Attorney, Agent, or Firm*—Stephen A. Gratton

(57) ABSTRACT

An improved method for sharpening emitter sites for cold cathode field emission displays (FEDS) includes the steps of: forming a projection on a baseplate; growing an oxide layer on the projection using a low temperature oxidation process; and then stripping the oxide layer. Preferred low temperature oxidation processes include: wet bath anodic oxidation, plasma assisted oxidation and high pressure oxidation. These low temperature oxidation processes grow an oxide film using a consumptive process in which oxygen reacts with a material of the projection. This permits emitter sites to be fabricated with less distortion and grain boundary formation than emitter sites formed with thermal oxidation. As an example, emitter sites can be formed of amorphous silicon. In addition, low temperature materials such as glass can be used in fabricating baseplates without the introduction of high temperature softening and stress.

22 Claims, 4 Drawing Sheets

U.S. PATENT DOCUMENTS

| | | | |
|---|---|---|---|
| 5,151,061 | 9/1992 | Sandhu | 445/24 |
| 5,162,704 | 11/1992 | Kobori et al. | 315/349 |
| 5,186,670 | 2/1993 | Doan et al. | 445/24 |
| 5,194,780 | 3/1993 | Meyer et al. | 315/306 |
| 5,199,917 | 4/1993 | MacDonald et al. | 445/24 |
| 5,201,992 | 4/1993 | Marcus | 156/643 |
| 5,205,770 | 4/1993 | Lowrey et al. | 445/24 |
| 5,210,472 | 5/1993 | Casper et al. | 315/349 |
| 5,228,878 | 7/1993 | Komatsu | 445/24 |
| 5,229,331 | 7/1993 | Doan et al. | 437/228 |
| 5,232,549 | 8/1993 | Cathey et al. | 456/633 |
| 5,259,799 | 11/1993 | Doan et al. | 445/24 |
| 5,266,350 | 11/1993 | Bagley et al. | 437/228 |
| 5,269,877 | 12/1993 | Bor | 167/628 |
| 5,283,500 | 2/1994 | Kochanski | 315/58 |
| 5,302,238 | 4/1994 | Rue et al. | 445/50 |
| 5,378,182 | 1/1995 | Liu | 445/50 |
| 5,389,026 | 2/1995 | Fukuta et al. | 445/50 |
| 5,532,544 | 7/1996 | Yoshioka et al. | 313/310 |
| 5,923,948 | 7/1999 | Cathey, Jr. . | |

OTHER PUBLICATIONS

Van Zant, Microchip Fabrication, 2nd Edition, 1990, pp. 156, 157, 364, 365.

"Perfect Formation During High Pressure, Low Temperature Steam Oxidation of Silicon", Katz et al., May 16, 1978, vol. 125, No. 10 pp. 1680,1683.

"Anodic Formation of oxide Films on Silicon", Apr. 1957, Journal of the Electrochemical Society, vol. 104, No. 4.

"Species Charge and Oxidation Mechanism In the Cathodic Plasma Oxidation of Silicon", Apr. 1991, Journal of Electrochemical Society, vol. 138, No. 4.

Wolf, Stanley, Silicon Processing For the VLSI ERA,vol. 1, Lattice Press (1986), pp. 174–180, 332.

METHOD FOR SHARPENING EMITTER SITES USING LOW TEMPERATURE OXIDATION PROCESS

CROSS REFERENCE TO RELATED APPLICATIONS

This application is a division of application Ser. No. 08/334,818 filed Nov. 4, 1994, U.S. Pat. No. 5,923,948.

This ivention was made with U.S. Goverment support under contract No. DABT63-93-C-0025 awarded by the Advanced Research Projects Agency (ARPA). The U.S. Goverment has certain rights in this invention.

FIELD OF THE INVENTION

The present invention relates to field emission displays (FEDs) and to methods for sharpening emitter sites used in FEDs and other electronic equipment.

BACKGROUND OF THE INVENTION

Flat panel displays have recently been developed for visually displaying information generated by computers and other electronic devices. These displays can be made lighter and require less power than conventional cathode ray tube displays. One type of flat panel display is known as a cold cathode field emission display (FED).

A cold cathode FED uses electron emissions to illuminate a cathodoluminescent screen and generate a visual image. A single pixel 10 of a FED is shown in FIG. 1. The FED includes a baseplate 11 (i.e., substrate) formed with a conductive layer 12. An emitter site 13 is formed on the conductive layer 12. The emitter site 13 is typically formed as a sharpened projection having a pointed apex. Alternately the emitter site 13 may be formed as a sharpened edge, as a multi-faceted structure (e.g., pyramidal) having a pointed apex or as an array of points.

A gate electrode structure, or grid 15, is associated with the emitter site 13. The grid 15 and baseplate 11 are in electrical communication with a voltage source 20. When a sufficient voltage differential is established between the emitter site 13 and the grid 15, a Fowler-Nordheim electron emission is initiated from the emitter site 13. Electrons 17 emitted at the emitter site 13 impinge on a cathodoluminescent display screen 16. The display screen 16 includes an external glass face 14, a transparent electrode 19 and a phosphor coating 21. The electrons impinging on the phosphor coating 21 increase the energy level of phosphors contained within the coating 21. When the phosphors return to their normal energy level, photons of light are released to form a visual image.

With a gated pixel 10, the grid 15 is electrically isolated from the baseplate 11 by an insulating layer 18. The insulating layer 18 also provides support for the grid 15 and prevents the breakdown of the voltage differential. The insulating layer 18 and grid 15 include a cavity 23 which surrounds the emitter site 13.

Individual pixels of field emission displays are sometimes referred to as vacuum microelectronic triodes. The triode elements include the cathode (field emitter site), the anode (cathodoluminescent screen) and the gate (grid). U.S. Pat. No. 5,210,472 to Casper et al.; U.S. Pat. No. 5,232,549 to Cathey et al.; U.S. Pat. No. 5,205,770 to Lowrey et al.; U.S. Pat. No. 5,186,670 to Doan et al.; and U.S. Pat. No. 5,229,331 to Doan et al. disclose various methods for forming elements of field emission displays.

Emitter sites for FEDs are typically formed of silicon or a metal such as molybdenum or tungsten. Other conductive materials such as carbon and diamond are also sometimes used. In order to provide a uniform resolution and brightness at the display screen, each emitter site should be uniformly shaped. In addition, emitter sites should be uniformly spaced from the display screen. Accordingly, different methods have been developed in the art for fabricating emitter sites on silicon and other substrates to insure a high degree of uniformity.

As an example, U.S. Pat. No. 5,151,061 to Sandhu, describes a method for forming self-aligned conical emitter sites on a silicon substrate. U.S. Pat. No. 5,259,799 to Doan et al. describes a method for forming self-aligned emitter sites and gate structures for FEDs.

In addition to being uniformly shaped and spaced, the emitter sites should also be sharp to permit optimal electron emission at moderate voltages. The voltage required to generate emission decreases dramatically with increased sharpness. For this reason during the FED fabrication process, thermal oxidation is typically used to sharpen emitter sites. As an example, with emitter sites formed of single crystal silicon, a thermal oxidation process can be used to form a layer of $SiO_2$ on a silicon projection. This surface oxide is then stripped using a wet etching process.

Improved techniques have been developed recently for oxidation sharpening single crystal silicon emitter sites. One such technique is described in the technical article by Marcus et al. entitled, "Atomically Sharp Silicon and Metal Field Emitters"; IEEE Transactions On Electron Devices, Vol. 38, No. 10, October (1991). In the Marcus et al. process, the emitter sites are 5 $\mu$m-high cones that are oxidation sharpened using a process in which single crystal silicon is thermally oxidized, preferably at a high temperature of 950° C. The emitter sites formed by this process have a radius of curvature at the apex of less than 1 nm. Another method for forming and sharpening single crystal silicon emitter sites is disclosed in U.S. Pat. No. 5,100,355 to Marcus et al. In this method a silicon protuberance is formed and then coated with a material which serves as a mold. The silicon is removed and the mold is filled with a metal. The mold is then removed to leave the metal protuberance.

One problem associated with prior art oxidation sharpening processes for forming emitter sites is that in general, these processes are performed at relatively high temperatures. As an example, for thermal oxidation processes, temperatures are typically on the order of 900°–1100° C. High oxidation temperatures prevent the successful sharpening of emitter sites made from a variety of materials. In general, these high temperature oxidation sharpening processes have been used in the past only with single crystal silicon emitter sites and not amorphous silicon. With emitter sites formed of amorphous silicon, degradation occurs during transformation of the amorphous silicon to polysilicon. At temperatures of about 600° C. and above, amorphous silicon can become polysilicon and generate grain boundaries and oxide fissures in an emitter site. Accelerated oxidation occurs along these grain boundaries and fissures.

A second problem associated with the high temperature oxidation of amorphous silicon is the formation of bumps or asperities on the surface of the emitter site. Again, this may cause a deformed or asymmetrical emitter site having non-uniform emissivity characteristics and poor resolution. In emitter sites that are designed to be symmetric, this results in poor resolution and high grid current.

Materials other than amorphous silicon, which are used in the construction of emitter sites, are also adversely effected by high temperature oxidation. As an example, emitter sites formed of metal, or metal-silicon composites may also experience distortion and grain boundary growth when subjected to high temperature oxidation processes.

Furthermore, high temperature oxidation processes completely preclude the use of some materials for fabricating other components of field emission displays such as baseplates (11, FIG. 1). As an example, float glass materials have relatively low strain and softening temperatures. With float glass, significant strain occurs at about 500° C. and significant softening occurs at about 700° C.

A further problem with high temperature oxidation sharpening processes are their adverse effect on circuit elements associated with the integrated circuitry for the emitter sites. Because the baseplate which contains the emitter sites is formed of various materials having different coefficients of thermal expansion, heating to high temperatures can cause stress failures. Aluminum alloy interconnects and contacts, may soften or flow at the high temperatures required by the oxidation process. In addition, it may sometimes be necessary to further sharpen or resharpen emitter sites in the presence of other circuit elements that may be adversely effected by the high temperatures.

FIGS. 2A and 2B illustrate the use of a prior art high temperature oxidation process for sharpening emitter sites formed of amorphous silicon. In FIG. 2A, an array of conically shaped amorphous silicon emitter sites 13 have been formed on a baseplate 11. As shown in FIG. 2A, each emitter site 13 projects from a surface of the baseplate 11 and includes an apex 32 having a blunt shape. During the oxidation sharpening process, a layer of oxide 24 (FIG. 2B) will be grown on the emitter site 13. After this oxide layer 24 is stripped, the radius of curvature at the apex 32 will be decreased and the emitter site 13 will be sharper.

As shown in FIG. 2B, during the oxidation sharpening process, a high temperature oxidizing gas 22 is directed over the emitter site 13 to form the oxide layer 24. This oxide layer 24 is subsequently stripped using a wet etch process. The high temperatures used during the oxidation process, however, will cause the amorphous silicon to become polysilicon and generate grain boundaries 25 where oxidation rates are faster. This results in oxide fissures 26 extending into the body of the emitter site 13 producing deformation and asymmetry. One problem with this structure is that a deformed emitter site will provide a non uniform electron emission. This in turn will cause poor resolution and high grid current in the FED and in some cases a higher "turn on" voltage.

OBJECTS OF THE INVENTION

In view of these and other shortcomings of prior art high temperature oxidation processes for sharpening emitter sites, there is a need in the art for improved methods for sharpening emitter sites. Accordingly, it is an object of the present invention to provide improved methods for sharpening emitter sites suitable for use in cold cathode field emission displays (FEDs) and other electronic equipment.

It is a further object of the present invention to provide improved methods for sharpening emitter sites at relatively low temperatures to prevent distortion of the emitter sites and detriment to other components associated with the emitter sites.

It is a still further object of the present invention to provide low temperature methods for sharpening emitter sites in order to reduce temperature stress and allow the use of improved materials such as amorphous silicon emitter sites and glass baseplates.

It is yet another object of the present invention to provide improved methods for sharpening emitter sites that are efficient, compatible with large scale fabrication processes, and which produce high quality emitter sites.

Other objects, advantages and capabilities of the present invention will become more apparent as the description proceeds.

SUMMARY OF THE INVENTION

In accordance with the present invention, an improved method for sharpening emitter sites for cold cathode field emission displays is provided. The method of the invention, generally stated, includes the steps of: forming raised projections on a baseplate (substrate); using a low temperature consumptive oxidation process to form an oxide layer on the projection; and then stripping the oxide layer to expose and sharpen the projections to form emitter sites. By way of example, the projections can be conically shaped with a pointed apex, wedge shaped with a blade-like apex, or pyramidal (multi-faceted) in shape with a sharpened apex.

Depending on the materials used, preferred low temperature consumptive oxidation processes for growing an oxide film to sharpen an emitter site include: wet bath anodic oxidation, plasma assisted oxidation, plasma cathodization and high pressure oxidation. In general, these low temperature oxidation processes utilize voltage or pressure rather than temperature, to enhance the rate of diffusion of an oxidizing or consumptive species into the emitter site. This overcomes many of the limitations associated with prior art high temperature thermal oxidation processes, such as the formation of grain boundaries and oxide fissures in amorphous silicon and metallic emitter sites. In addition, it permits low temperature materials, such as glass baseplates, to be used in the formation of various circuit components of display devices. Furthermore, the method of the invention can be used to sharpen, resharpen or further sharpen emitter sites, without detrimentally affecting circuit elements, such as metal interconnects, associated with display devices.

DETAILED DESCRIPTION OF PREFERRED EMBODIMENTS

Wet Bath Anodic Oxidation

In one aspect of the present invention a wet bath anodic oxidation process is used to sharpen silicon emitter sites.

Figure 1:
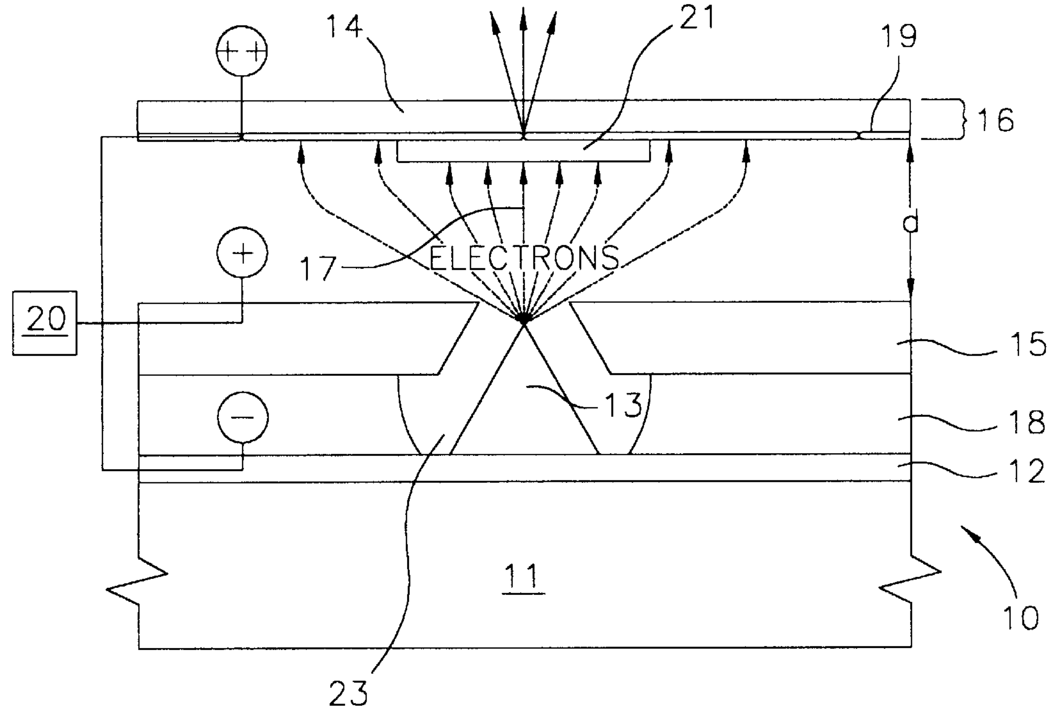
FIGURE 1 (PRIOR ART)
FIG. 1 is a schematic drawing showing a prior art FED pixel.
Figure 2A:
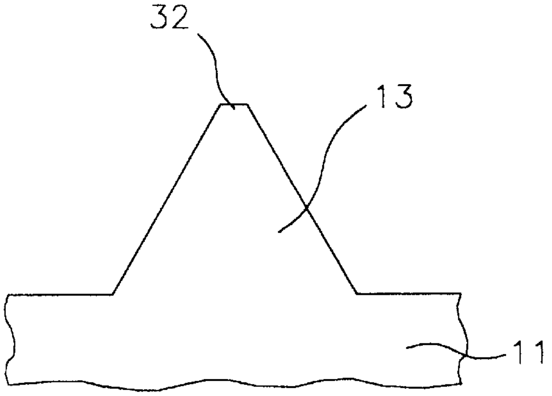
FIGURE 2A (PRIOR ART)
FIG. 2A is a schematic view of a prior art emitter site prior to oxidation sharpening.
Figure 2B:
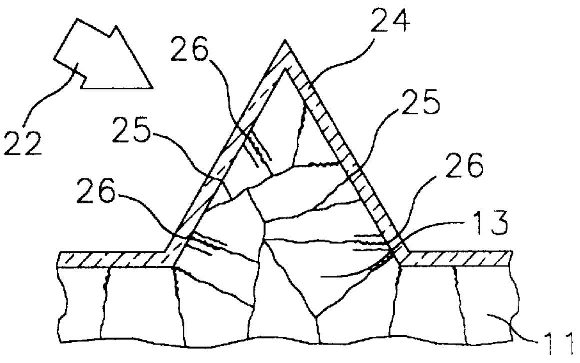
FIGURE 2B (PRIOR ART)
FIG. 2B is a schematic view of an emitter site illustrating the formation of grain boundaries and oxide fissures during a prior art high temperature oxidation sharpening process.
Figure 3A:
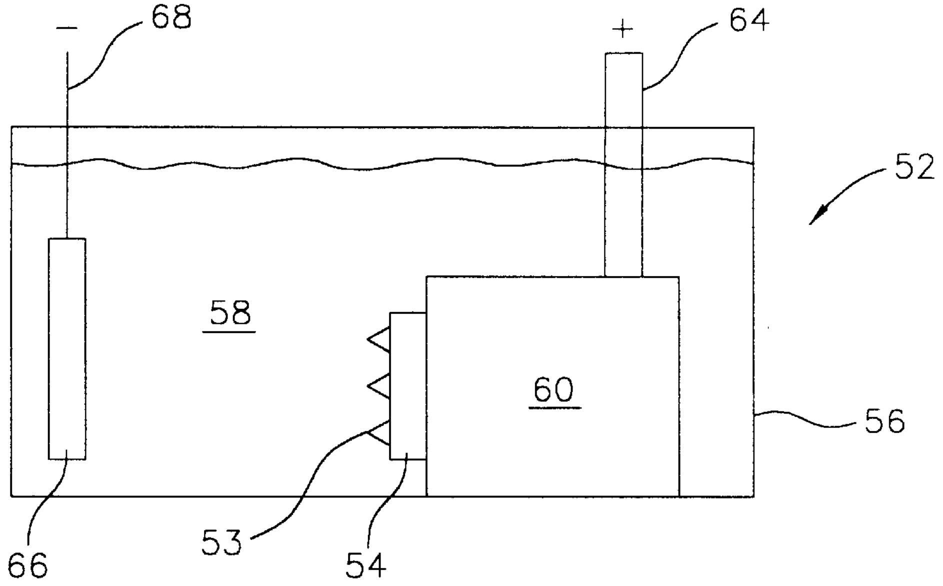
FIGS. 3A and 3B are schematic drawings of wet bath anodic oxidation systems for forming emitter sites in accordance with the invention.

FIG. 3A illustrates a wet bath anodic oxidation system 52 suitable for forming an oxide layer on silicon emitter sites 53 formed on a baseplate 54. The baseplate 54, which is also sometimes referred to in the art as a substrate, is formed of a rigid material such as silicon or float glass. Float glass, which is also known as soda lime float glass, is a commerically available glass material that is fabricated from sand and lime using a furnace.

The wet bath anodic oxidation system 52 includes an enclosed tank 56 filled with an electrolytic solution 58. Suitable electrolytic solutions include n-methyl acetamide+de-ionized water+$KNO_3$. Electrolytic solutions may also contain $H_3PO_4$/water or $HNO_3$/water. The baseplate 54 is attached to a holder 60 which is connected to a positive electrode 64 or anode. A cathode 66 formed of a conductive material such as stainless steel, or a same material as the emitter site 53, is connected to a negative electrode 68.

In this system the oxide (i.e., $SiO_2$) is grown instead of being deposited. This means that the grown oxide is a result of a chemical consumption of the silicon and not a deposition on the surface of silicon. Solid waste by-products are also produced by the consumptive process. The net result, however, is a sharpening effect (i.e., decrease in radius of curvature at apex of emitter site 53) after the oxide is removed. In the system illustrated in FIG. 3A, the driving voltage applied between the negative electrode 68 and the positive electrode 64 is the single most important factor in determining the thickness of the oxide layer. Higher voltages will result in thicker oxides being grown.

One theory of growth mechanism, which accounts for the voltage dependency, is that the silicon from the emitter site 53 migrates through the growing oxide layer to the solution where oxygen is being electrochemically produced. The migrating silicon atoms react with the oxygen to form additional oxidized silicon. The oxide can be formed at relatively low temperatures of less than 100° C. For sharpening the emitter sites 53, oxide thickness are between about 500 Å to 5000 Å. A thickness of about 1000 Å being preferred.

By way of example, emitter sites 53, approximately 1.2 micron in height and conical in shape were fabricated using an etching process from boron doped 10–14 Ω-cm silicon. The emitter sites 53 were then sharpened by using a wet bath anodic oxidation process as illustrated in FIG. 3A. Subsequently, the oxide was removed by wet chemical removal. The electrolytic solution comprised by weight 97.05% n-methyl acetamide, 2.525% deionized water and 0.425% $KNO_3$ at a temperature of 70° C. The cathode 66 was formed of aluminum. An oxide film of 1100 Å was grown. The electrical current was held relatively constant during a 43 minute growth period. The voltage increased from an initial 170 volts, to 236 volts at 10 minutes, 266 volts at 20 minutes, 296 volts at 30 minutes, 338 volts at 40 minutes and 350 volts at 43 minutes. After oxide growth the sample was rinsed in deionized water and then exposed to an HF solution containing 7:1 buffered oxide etchant acid, for 40 seconds, to remove the oxide layer. This was followed by rinsing in de-ionized water, followed by drying.

Because the wet bath anodic oxidation process is performed at such low temperatures, distortion of the emitter sites is minimized. In addition, the low temperature anodic oxidation process can be performed after various circuit element (e.g., aluminum contacts) have been formed without detriment to these elements.

Figure 3B:
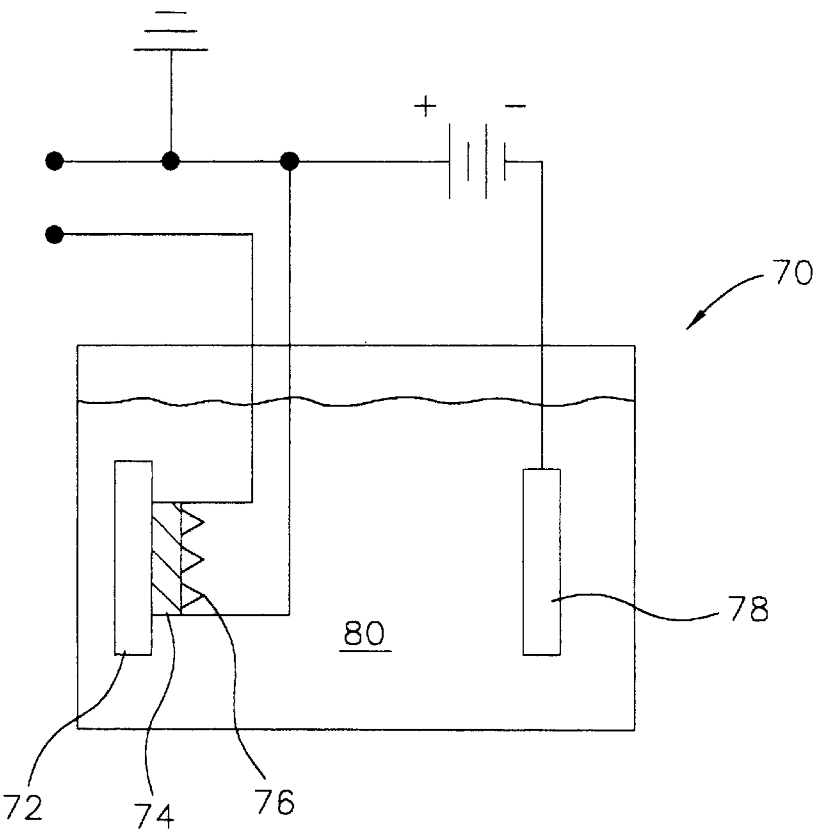

With reference to FIG. 3B, a wet bath anodic oxidation system 70 similar to that shown in FIG. 3A can be used to oxidize the surface of emitter sites 76 formed of a metal, silicon or a silicon-metal composite. In the wet bath anodic oxidation system 70, the baseplate 74 may be mounted on a holder 72. In this system, the baseplate 74 and emitter sites 76 are connected to a positive electrode and are the anode. A cathode plate 78 is connected to a negative electrode. The electrolytic solution 80 is a solution which produces an oxide layer on the emitter sites 76 but does not dissolve the grown oxide 76. For molybdenum, silicon, tantalum or aluminum emitter sites, a suitable electrolytic solution contains 388 grams of n-methyl acetamide, 10 grams of $H_2O$ and 1.7 grams of $KNO_3$. Such a system can be operated at a temperature of less than 100° C.

Plasma Assisted Oxidation

Plasma assisted oxidation of silicon is similar to the wet bath system 52 (FIG. 3A) described above except that the electrolyte is replaced with an oxygen plasma. This technique can be carried out in an oxygen discharge generated by radio frequency (RF) or a dc electron source. As an example, an oxygen plasma can be generated by the application of high-energy radio-frequency (RF) fields (e.g. 13.56 M Hz) contained at a reduced pressure (e.g., 0.1 torr). Such a plasma can be employed to grow oxide at a lower temperature (e.g., 300° C.–700° C.) than a thermal system that generally takes place above 800° C. With low temperature plasma assisted oxidation, oxygen ions are extracted from the plasma by the dc silicon anode causing the silicon to migrate and form a silicon dioxide layer on the substrate. The $SiO_2$ growth rate increases with increasing temperature, plasma density and substrate doping concentration.

Plasma oxidation systems can be classified further into different types. In an "anodic plasma oxidation" system, the oxidized substrate is externally positively biased. In a "cathodic plasma oxidation" system the substrate is at floating potential, but because of confinement of the plasma, oxidation occurs on the surface facing away from the plasma. An anodic plasma oxidation system is described in the technical article by P. F. Schmidt and W. Michel entitled "Anodic Formation of Oxide Films on Silicon", *Journal of the Electrochemical Society*, April 1957, pages 230–236. A cathodic plasma oxidation system is described in the technical article by Kamal Eljabaly and Arnold Reisman entitled "Growth Kinetics and Annealing Studies of the "Cathodic" Plasma Oxidation of Silicon", *Journal of the Electrochemical Society*, Vol. 138, No. 4, April 1991. In addition, cathodic plasma oxidation processes are described in U.S. Pat. Nos. 4,323,589 and 4,232,057 to A. K. Ray and A. Reisman and U.S. Pat. No. 5,039,625 to Reisman et al.

In accordance with the present invention, a cathodic plasma oxidation process can be used to sharpen emitter sites. Such a cathodic plasma oxidation process utilizes a process chamber in flow communication with highly purified oxygen gas (e.g., 99.993% $O_2$). The oxygen gas is included in an inert gas such as argon.

Figure 4A:
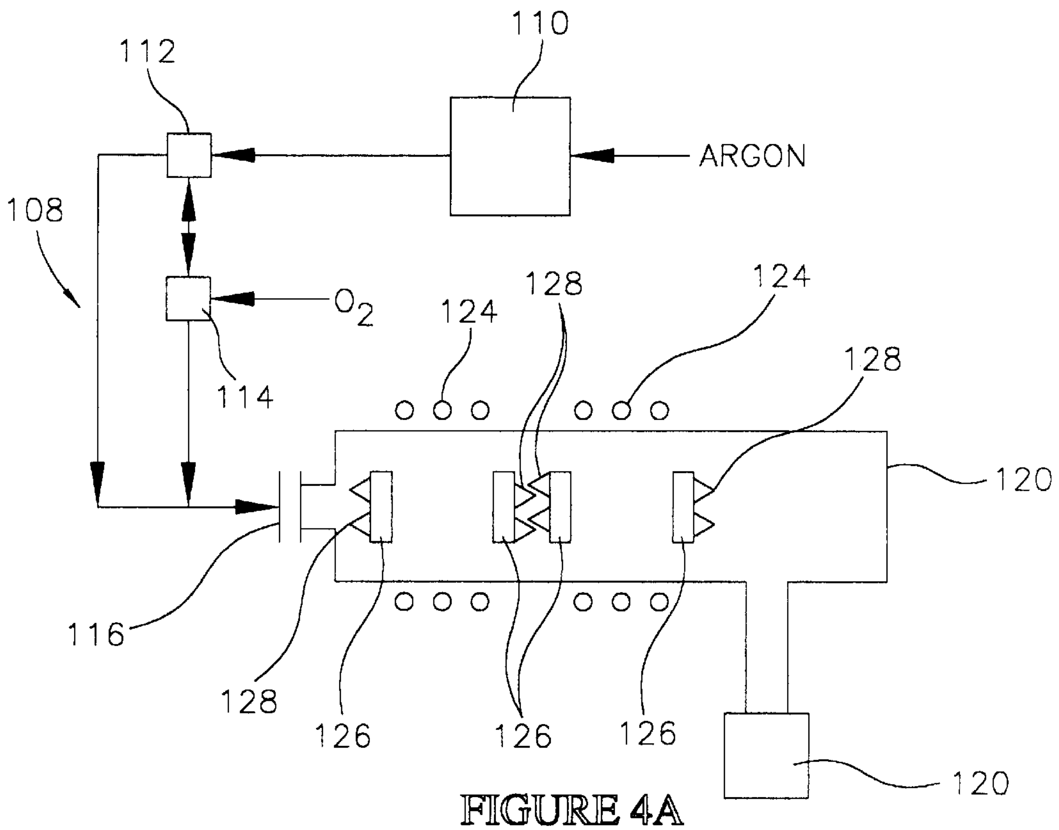
FIG. 4A is a schematic drawing of a low temperature cathodic plasma oxidation system for forming emitter sites in accordance with the invention.

FIG. 4A illustrates a cathodic plasma oxidation system 108. In the cathodic plasma oxidation system 108, high purity argon is produced by taking the boil-off from a liquid argon source. This argon gas is purified further by passing it over a titanium bed in a two zone furnace 110. The first zone of the furnace is heated to strip the oxygen from any residual water vapor by oxidizing the titanium. The hydrogen released is then absorbed by the titanium in the second zone. The purified argon is then mixed with high purity oxygen (e.g., bottled $O_2$ with a purity of 99.993%). Mass flow controllers 112 and 114 control the gas flow into the process chamber of a reactor tube 118.

The high purity gas mixture containing oxygen is injected through an o-ring joint 116 into the reactor tube 118. The reactor tube 118 is a vessel formed of fused silica. The interior of the reactor tube 118 is in flow communication with a turbo-molecular pump 120 that continuously pumps the system to a negative pressure. RF coils 122, 124 surround the reactor tube 118 and are coupled to one or more RF power supplies. The RF coils 122, 124 are used to effect wave coupling with the high purity gas mixture injected into the reactor tube 118. The RF coils 122, 124 each form separate areas within the reactor tube 118 wherein distinct plasma clouds are generated and confined. Silicon baseplates 126 on which the emitter sites 128 have been formed are held in a quartz boat within the reactor tube 118 perpendicular to the direction of gas flow. One side of each baseplate 126, containing the emitter sites 128, is outside of the plasma that is confined between the RF coils 122 or 124. Oxidation occurs on the emitter sites 128 which are facing away from the RF coils 122 or 124.

Such a cathodic plasma system 108 can form oxides at a temperature of around 300° C. to 700° C. The thickness of the oxide will depend on the pressure, time, temperature, radio frequency and RF power. These parameters may be adjusted to obtain a desired oxide thickness. As an example, oxide thicknesses may range from 500 Å to 3000 Å.

Figure 4B:
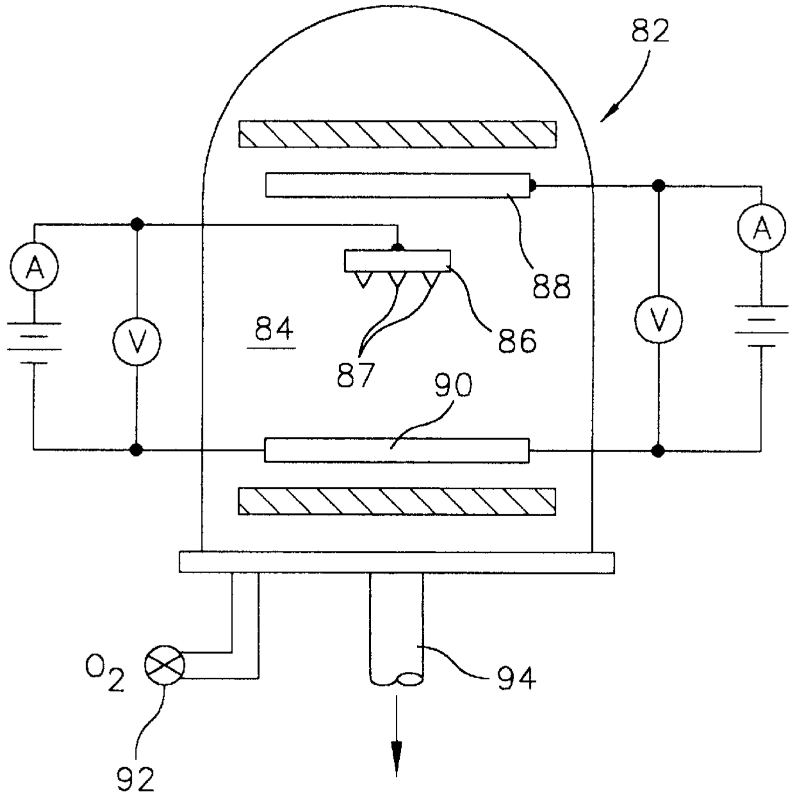
FIG. 4B is a schematic drawing of a low temperature plasma anodizing system for forming emitter sites in accordance with the invention.

FIG. 4B illustrates an anodic plasma oxidation system 82 suitable for oxidizing emitter sites formed of silicon, metal, or a metal silicon composite. In the anodic plasma oxidation system 82, an enclosed process chamber 84 is in flow communication with an $O_2$ plasma source 92 maintained by a glow discharge serving as the oxygen reservoir. The process chamber is also in flow communication with a vacuum source 94. The process chamber 84 contains the baseplate 86, a cathode 88 and an anode 90. The baseplate 86 containing the emitter sites 87 is connected to a positive electrode and forms the anode 90. This arrangement permits the application of a positive bias to the emitter sites. In this system the mechanism of film growth is essentially similar to electrochemical anodization (FIG. 3A) in that the oxide growth is a function of the anodizing voltage. Representative process variables include oxygen pressure (0.1 Torr), power (e.g., 200 W) and temperature (600° C. to 800° C.). Such an anodic plasma oxidation system 82 also permits the anodization of metals which may be dissolved by the commonly used electrolytes.

High Pressure Oxidation

One other technique for low temperature oxidation of silicon is to grow the $SiO_2$ in a high pressure environment. Commercial high pressure oxidation systems are sold under the trademark HiPOx® manufactured by GaSonics and under the trademark FOX® manufactured by Thermco Systems.

In addition, a low temperature, high pressure oxidation process for silicon is described in the technical article by L. E. Katz and L. C. Kimerling, entitled "Defect Formation During High Pressure, Low Temperature Steam Oxidation of Silicon", *Journal of Electrochemical Society*, Vol. 125, No. 10, pages 1680–1683 (1978).

Figure 5:
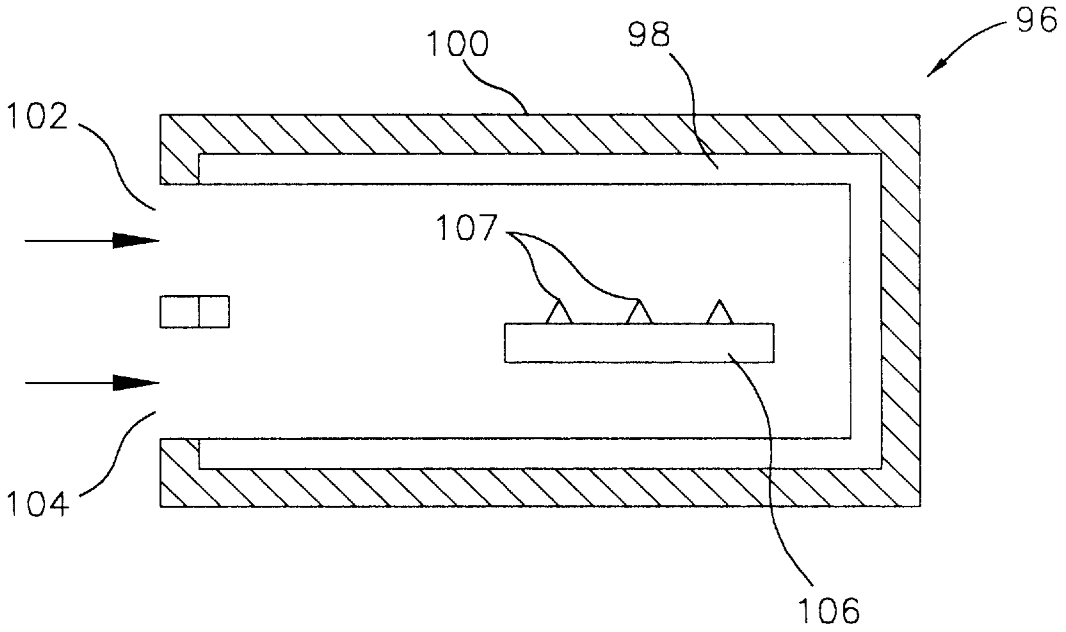
FIG. 5 is a schematic drawing of a high pressure oxidation system for forming emitter sites in accordance with the invention.

A high pressure oxidation system 96 is shown in FIG. 5. The high pressure oxidation system 96 includes a quartz tube 98 reinforced with a stainless steel jacket 100. An inlet 102 is provided for a high pressure inert gas. Another inlet 104 is provided for a high pressure oxidant gas such as high purity water or a dry oxidant such as oxygen ions. The baseplate 106 having emitter sites 107 is placed within the quartz tube 98. The quartz tube 98 is sealed and the oxidant is pumped into the tube at elevated pressures of about 10 to 25 atmospheres. The entire system 96 is heated to a predetermined oxidation temperature.

With such a high pressure oxidation system 96 the increased pressures allow an oxidation process to be performed at a lower temperature. A one atmosphere increase in pressure translates to about a 30° C. drop in temperature. As an example, temperatures as low as about 700° C. can be used at pressure as high as about 25 atmospheres. Such a system 96 is particularly suited to growing oxide films on silicon. The growth of oxide films on silicon using high pressure steam is linear in time and directly proportional to pressure over a certain range of time, temperature and pressure.

Whichever method of oxide formation is utilized (i.e. wet bath anodization, plasma assisted oxidation, or high pressure oxidation) following generation of the oxide layer, the surface oxide is stripped from the emitter site. For a silicon dioxide layer formed on a silicon substrate, the surface oxide may be stripped using a wet etchant, such as concentrated hydrofluoric acid or a buffered hydrofluoric solution. Other oxides can be stripped with other etchants known in the art. In addition to a wet etch process for stripping the oxide layer, dry etch processes such as plasma etching may also be utilized.

For enhanced sharpness and uniformity in the emitter sites, oxidation processing and stripping may be repeated several times. Because of the low processing temperatures used with the method of the invention, sharpening can be performed without detriment to circuit elements such as solid state junctions and metal interconnects. This also permits sharpening to be performed after the solid state elements and metal interconnects for the FED cell have been substantially completed.

While the method of the invention has been described with reference to certain preferred embodiments, as will be apparent to those skilled in the art, certain changes and modifications can be made without departing from the scope of the invention as defined by the following claims.

What is claimed is:

1. A method for sharpening emitter sites of a field emission display comprising:

providing a baseplate comprising a plurality of silicon projections;

forming oxide layers on the silicon projections using high pressure oxidation by placing the baseplate in a heated process chamber containing an oxidant gas at a pressure of about 10 to 25 atmospheres, and at a temperature between at least 700° C. but less than a second temperature selected to prevent substantial distortion of the silicon projections;

following forming of the oxide layers, removing the baseplate from the heated process chamber; and stripping the oxide layers from the silicon projections.

2. The method of claim 1 wherein the temperature is about 700° C.

3. The method of claim 1 wherein the temperature is about 700° C. and the silicon projections comprises amorphous silicon.

4. A method for sharpening an emitter site of a field emission display comprising:

providing a baseplate;

forming a projection comprising silicon on the baseplate;

providing a high pressure oxidation system comprising a process chamber;

placing the baseplate within the process chamber;

pumping an oxidant gas into the process chamber to a pressure of about 10 to 25 atmospheres;

heating the oxidant gas to a temperature of about 700° C.;

growing a ($SiO_2$) layer on the projection without substantial distortion of the projection due to the temperature;

following the growing step, removing the baseplate from the process chamber; and stripping the ($SiO_2$) layer from the projection.

5. The method of claim 4 wherein the projection comprises amorphous silicon.

6. The method of claim 4 wherein the baseplate comprises glass and the projection comprises amorphous silicon.

7. A method for sharpening an emitter site of a field emission display comprising:

providing a substrate comprising a silicon projection;

providing an oxidation system comprising a process chamber;

placing the substrate in the process chamber;

pumping an oxidant gas into the process chamber to a pressure of at least about 10 atmospheres;

heating the oxidant gas to a temperature selected to prevent substantial distortion of the silicon projection;

growing an oxide layer on the silicon projection; and stripping the oxide layer from the silicon projection.

8. The method of claim 7 wherein the oxide layer comprises ($SiO_2$) the temperature prevents formation of oxide fissures on the oxide layer.

9. The method of claim 7 wherein the stripping step comprises applying a solution of hydrofluoric acid to the oxide layer.

10. The method of claim 7 wherein the stripping step comprises dry etching the oxide layer.

11. The method of claim 7 wherein the temperature is about 700° C.

12. The method of claim 7 wherein the substrate comprises a alass baseplate.

13. The method of claim 7 wherein the oxidant gas comprises oxygen or oxygen ions.

14. The method of claim 7 wherein the oxidant gas comprises oxygen and water.

15. The method of claim 7 wherein the pressure is about 10 to 25 atmospheres.

16. A method for sharpening emitter sites of a field emission display comprising:

providing a baseplate comprising a plurality of silicon projections;

providing an oxidation system comprising a process chamber configured to contain an oxidant gas;

placing the baseplate in the process chamber;

pumping the oxidant gas into the process chamber to a pressure of at least about 10 atmospheres;

heating the oxidant gas to a temperature selected to prevent substantial distortion of the silicon projections;

growing oxide layers on the silicon projections without forming fissures and substantially distorting the silicon projections due to the temperature; and stripping the oxide layers from the silicon projections.

17. The method of claim 16 wherein the temperature is about 700° C.

18. The method of claim 16 wherein the oxidant gas comprises oxygen and water.

19. The method of claim 16 wherein the silicon projections comprise amorphous silicon.

20. A method for sharpening emitter sites of a field emission display comprising:

providing a baseplate comprising a plurality of silicon projections;

providing an oxidation system comprising a process chamber configured to contain an oxidant gas;

placing the baseplate in the process chamber;

pumping the oxidant gas into the process chamber to a pressure of at least about 10 atmospheres;

heating the oxidant gas to a temperature of at least about 700° C. but less than a second temperature at which substantial distortion of the silicon projections occurs;

growing oxide layers on the silicon projections without substantially distorting the silicon projections; and stripping the oxide layers from the silicon projections.

21. The method of claim 20 wherein the silicon projections comprise amorphous silicon.

22. The method of claim 20 wherein the second temperature is about 700° C.

* * * * *